(12) United States Patent
Parrish

(10) Patent No.: US 6,215,320 B1
(45) Date of Patent: Apr. 10, 2001

(54) HIGH DENSITY PRINTED CIRCUIT BOARD

(75) Inventor: Frank Parrish, Simi Valley, CA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/178,247

(22) Filed: Oct. 23, 1998

(51) Int. Cl.$^7$ .................................................. G01R 31/02
(52) U.S. Cl. .............................................. 324/754; 428/209
(58) Field of Search .................................. 324/754, 755, 324/761, 762, 765; 428/209, 210; 439/482

(56) References Cited

U.S. PATENT DOCUMENTS

| | | |
|---|---|---|
| 3,739,469 | 6/1973 | Dougherty, Jr. . |
| 4,912,399 * | 3/1990 | Greub et al. .......................... 324/754 |
| 5,144,228 | 9/1992 | Sorna et al. ....................... 324/158 P |
| 5,162,728 | 11/1992 | Huppenthal . |
| 5,225,777 | 7/1993 | Bross et al. . |
| 5,336,992 | 8/1994 | Saito et al. ........................... 324/784 |
| 5,439,732 * | 8/1995 | Nagasaka et al. .................... 428/210 |
| 5,629,631 | 5/1997 | Perry et al. . |
| 5,665,459 * | 9/1997 | Fukuta et al. ........................ 428/209 |
| 5,742,174 | 4/1998 | Kister et al. . |
| 5,949,245 * | 9/1999 | Lui ....................................... 324/762 |

FOREIGN PATENT DOCUMENTS

| | | | |
|---|---|---|---|
| 0 864 870 | 9/1998 | (EP) | ............................. G01R/1/073 |
| 6-302964 | 10/1994 | (JP) | ................................. H05K/3/46 |

* cited by examiner

Primary Examiner—Safet Metjahic
Assistant Examiner—Minh Tang
(74) Attorney, Agent, or Firm—Lance M. Kreisman

(57) ABSTRACT

A multi-level circuit board for efficiently routing electrical signals is disclosed. The circuit board includes a contact layer comprising a first substrate and formed with a set of contact pads disposed across a relatively large surface area. The contact layer also includes a set of engagement contacts corresponding to the contact pads and arrayed in a densely packed surface area. A plurality of subsequent layers are disposed in fixed stacked relationship to the contact layer. Each subsequent layer includes a subsequent substrate, and a conductive pattern formed on the subsequent substrate and defining a plurality of signal paths. Conductive vias are coupled to the contact pads and the engagement contacts and are formed through the contact layer and one or more of the plurality of subsequent layers. The vias communicate with the respective signal paths and include selected sets of staggered vias configured to optimize the routing of the signal paths along the respective subsequent layers.

15 Claims, 8 Drawing Sheets

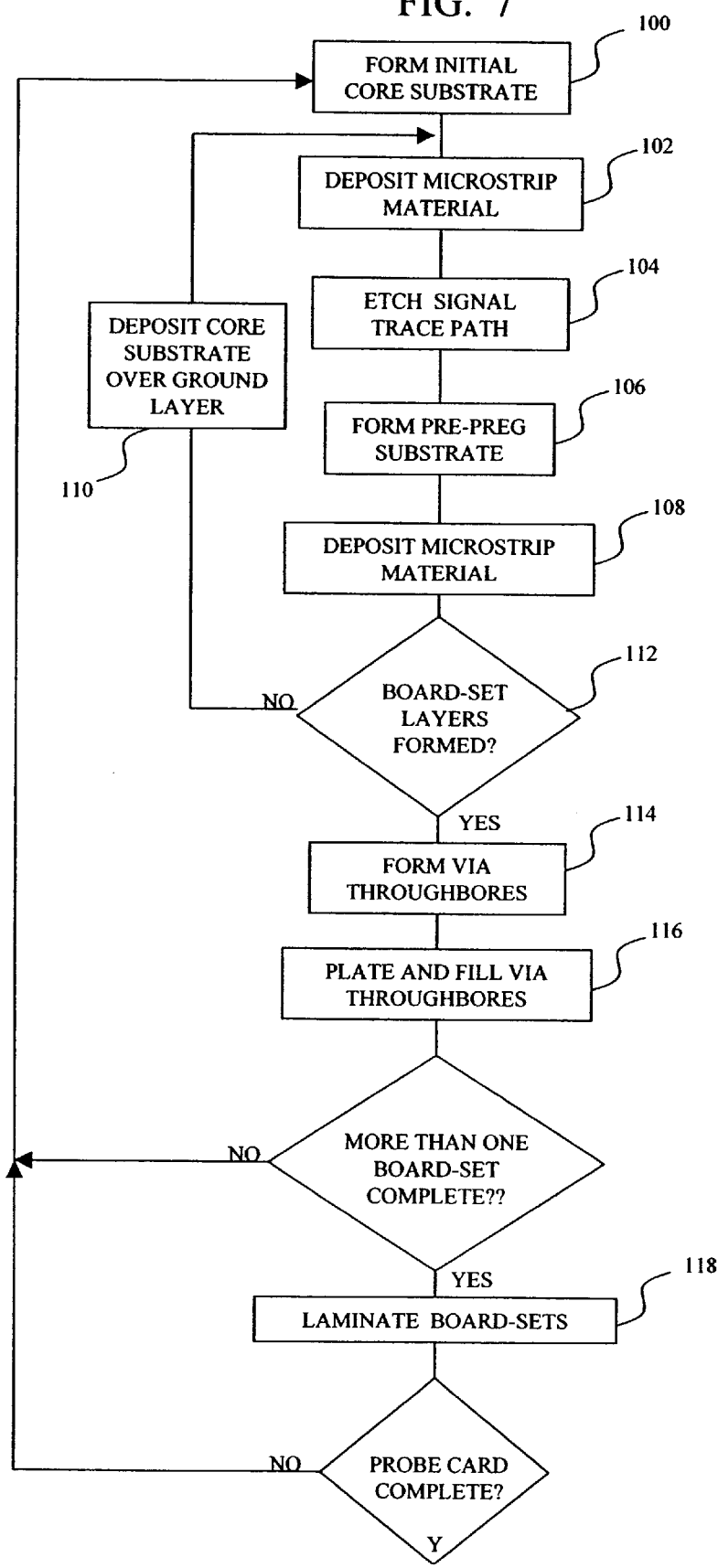

HIGH DENSITY PRINTED CIRCUIT BOARD

FIELD OF THE INVENTION

The invention relates generally to multi-layer printed circuit boards for use in semiconductor automatic test equipment and more particularly a high-density multi-level circuit board assembly for efficiently routing a high number of signal paths to a densely packed contact array.

BACKGROUND OF THE INVENTION

In the field of semiconductor automatic test equipment, multi-level printed circuit boards (PCB's) play a critical role in routing numerous signals between fairly large test subsystems, and relatively small devices under test (DUT's). The equipment, often individually referred to as a "tester", generates and receives test data signals and test control signals to and from one or more DUT's. Depending on whether the tester is of the "prober" type or "package" type, the tests take place at the wafer and packaged-device levels, respectively.

To functionally test devices at the wafer level, the conventional probe type tester generally includes a test controller, such as a computer, that generates waveforms to be applied to one or more of the wafer DUT's. A test head is disposed downstream of the test controller and includes pin electronics for generating test signals in fairly close proximity to the DUT's to minimize time delays and signal attenuation. Data and control signals are routed from the pin electronics through a probecard that physically interfaces with one or more DUT's on the wafer. The signals generated by the test controller are fed to the DUT's that produce responsive output signals. The probecard captures and transmits the DUT outputs back to the test controller for comparison with sets of expected output values.

Key considerations in the selection of automatic test equipment involve the cost per DUT "site", testing capabilities of the tester, and device interface flexibility. The cost consideration may be further broken down to initial purchase price of the tester, facilities costs, wafer throughput, and yield. Wafer throughput reflects the number of wafers processed per unit time, while the yield refers to the number of acceptable devices that survive test versus the original volume of devices. Consequently, the more DUT's that can be tested in parallel, the higher the throughput. One area open to improvement in this regard is the construction of a probecard that allows simultaneous testing of fairly large arrays of DUT's such as memory devices.

Conventional probe card constructions often employ a multi-level PCB formed with a peripheral annular array of spaced-apart contact pads for engaging corresponding test head contacts or pogos. The center of the board is formed with a relatively small rectangular opening around which is disposed a plurality of contacts corresponding to the spaced-apart peripheral pads. The contacts and pads are coupled electrically through the multiple layers of the card by cylindrical conductive vias. The vias are formed with a predetermined diameter and disposed vertically through one or more layers of the card to serve as inter-layer paths. An array of formed tungsten needles couples to the contacts and projects inwardly and downwardly toward one or more DUT pads as the opening is registered over the DUT. Each needle is about an inch in length.

In operation, the test head of the tester manipulates the probecard needles for registration over a plurality of DUT contacts. The probecard is then positioned to allow the needles to physically engage the DUT contacts on the wafer. Test signals are then generated by the tester pin electronics and applied to the DUTs in parallel. When the array of DUTs finishes test, the probe card is manipulated to engage another array of DUTs. This process repeats a number of times until the wafer is substantially fully probed.

While the foregoing tester construction is beneficial for its intended applications, it suffers from several disadvantages. For example, under circumstances requiring simultaneous testing of fairly large DUT arrays having 32 or more devices, the use of needles becomes cumbersome and somewhat difficult to implement. Moreover, the lengths of the needles often creates a non-50 ohm environment, due to inductive effects, that often limits the testing bandwidth to about 60 MHz or less.

What is needed and heretofore unavailable is a PCB probecard for use in a tester to efficiently rout a large number of high frequency, impedance matched signal paths through the various layers of the probecard to couple relatively spaced-apart contact pads to corresponding contacts disposed in a densely packed prober array. The high density probe card and method of manufacture of the present invention satisfies these needs.

SUMMARY OF THE INVENTION

The high density probecard and method of manufacture of the present invention provides an efficient and cost-effective way of routing high frequency signals between a test head and an array of DUT's. The improved routing enables a substantial increase in the packing density of respective signal paths without requiring additional board layers. This, in turn, provides compatibility with conventional interface hardware.

To realize the foregoing advantages, the invention in one form comprises a multi-level circuit board for efficiently routing electrical signals. The circuit board includes a contact layer comprising a first substrate and formed with a set of contact pads disposed across a relatively large surface area. The contact layer also includes a set of interconnect contacts corresponding to the contact pads and arrayed in a densely packed surface area. A plurality of subsequent layers are disposed in fixed stacked relationship to the contact layer. Each subsequent layer includes a subsequent substrate, and a conductive pattern formed on the subsequent substrate and defining a plurality of signal paths. Conductive vias are coupled to the contact pads and the engagement contacts and are formed through the contact layer and one or more of the plurality of subsequent layers. The vias communicate with the respective signal paths and include selected sets of staggered vias configured to optimize the routing of the signal paths along the respective subsequent layers.

In another form, the invention comprises a probecard for use in an automatic test system to rout signals between a test controller and a parallel array of devices under test. The probecard includes a contact layer comprising a disk-shaped substrate and formed peripherally with an annular array of relatively spaced-apart contact pads. The contact layer includes a centrally disposed rectangular array of relatively densely packed probe contacts. A plurality of signal layers are disposed in fixed stacked relationship to the contact layer. Each signal layer includes a signal substrate, and a conductive pattern formed on the signal substrate and defining a plurality of signal paths. Conductive vias are coupled to the contact pads and the probe contacts and are formed through the contact layer and one or more of the plurality of signal layers. The vias communicate with the respective signal paths and include selected sets of staggered vias configured to optimize the routing of the signal paths along the respective signal layers.

In yet another form, the invention comprises a massively parallel automatic test system for simultaneously testing an array of devices under test on a wafer. The system includes a test controller and a test head disposed downstream of the test controller. A wafer fixture is positioned beneath the test head for mounting a wafer having a plurality of arrays of devices under test. The system further includes a probecard to rout signals between the test controller and the parallel array of devices under test. The probecard includes a contact layer comprising a disk-shaped substrate and formed peripherally with an annular array of relatively spaced-apart contact pads. The contact layer also includes a centrally disposed rectangular array of relatively densely packed probe contacts. A plurality of signal layers are disposed in fixed stacked relationship to the surface layer. Each signal layer includes a signal substrate, and a conductive pattern formed on the signal substrate and defining a plurality of signal paths. Conductive vias are coupled to the contact pads and the probe contacts and are formed through the contact layer and one or more of the plurality of signal layers. The vias communicate with the respective signal paths and include selected sets of staggered vias configured to optimize the routing of the signal paths along the respective signal layers.

In yet another form, the invention comprises a method of manufacturing a multi-level circuit board. The method includes the steps of fabricating a first board-set formed with a plurality of board layers and including a first set of conductive vias formed through the board layers. A second board-set is fabricated and formed substantially similar to the first board set and includes a second set of conductive vias disposed in corresponding alignment with the first set of conductive vias. The second board set further includes a staggered set of conductive vias disposed in an adjacent array to the second set of vias. The method further includes the step of laminating the second board-set beneath the first board-set to couple the first and second sets of vias and define a first via subsection while the staggered set of conductive vias defines a second via subsection.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which

FIG. 7 is a flowchart showing the steps employed in manufacturing the probecard of the present invention according to one embodiment.

DETAILED DESCRIPTION OF THE INVENTION

Figure 1:
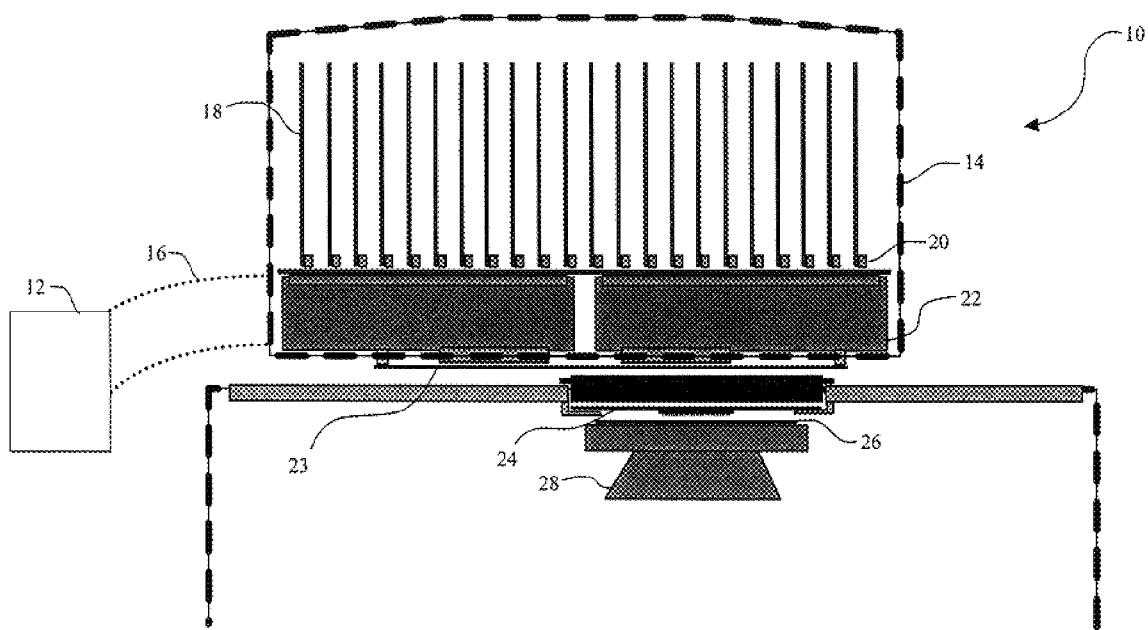
FIG. 1 is a block diagram of an automatic test system employing the probecard of the present invention.

Referring now to FIG. 1, an automatic test system according to one form of the invention, generally designated 10, includes a computer-driven test controller 12, and a test head 14 connected to the controller by a heavy-duty multi-cable 16. The test head generally comprises a plurality of channel cards 18 that mount pin electronics (not shown) necessary to generate the test signals or patterns to each input pin or contact of a plurality of DUTs (not shown). A vertical translator board 22 carries the channel cards and routs respective channel signals to a probecard assembly, generally designated 24, that physically engages a wafer 26.

Figure 2:
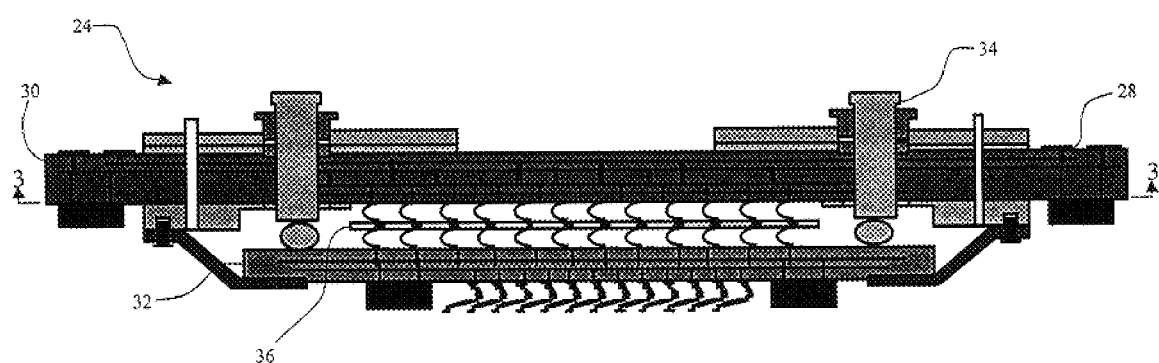
FIG. 2 is an enlarged side view of a probecard assembly used in the tester of FIG. 1.

With particular reference to FIG. 2, the probecard assembly 24 includes a multi-layered disk-shaped probecard 30 (FIGS. 3–5), fixed in a multi-point alignment fixture with a microspring-tipped probe pin interface 32 available, for example, from Formfactor Inc., Livermore Calif. The alignment fixture preferably includes a three-point planarizer 34 as more fully disclosed in U.S. Pat. No. 5,821,764, titled "Interface Apparatus For Automatic Test Equipment", assigned to the assignee of the present invention and expressly incorporated herein by reference. A resilient microspring interposer 36 is disposed between the probecard and the prober.

Figure 3:
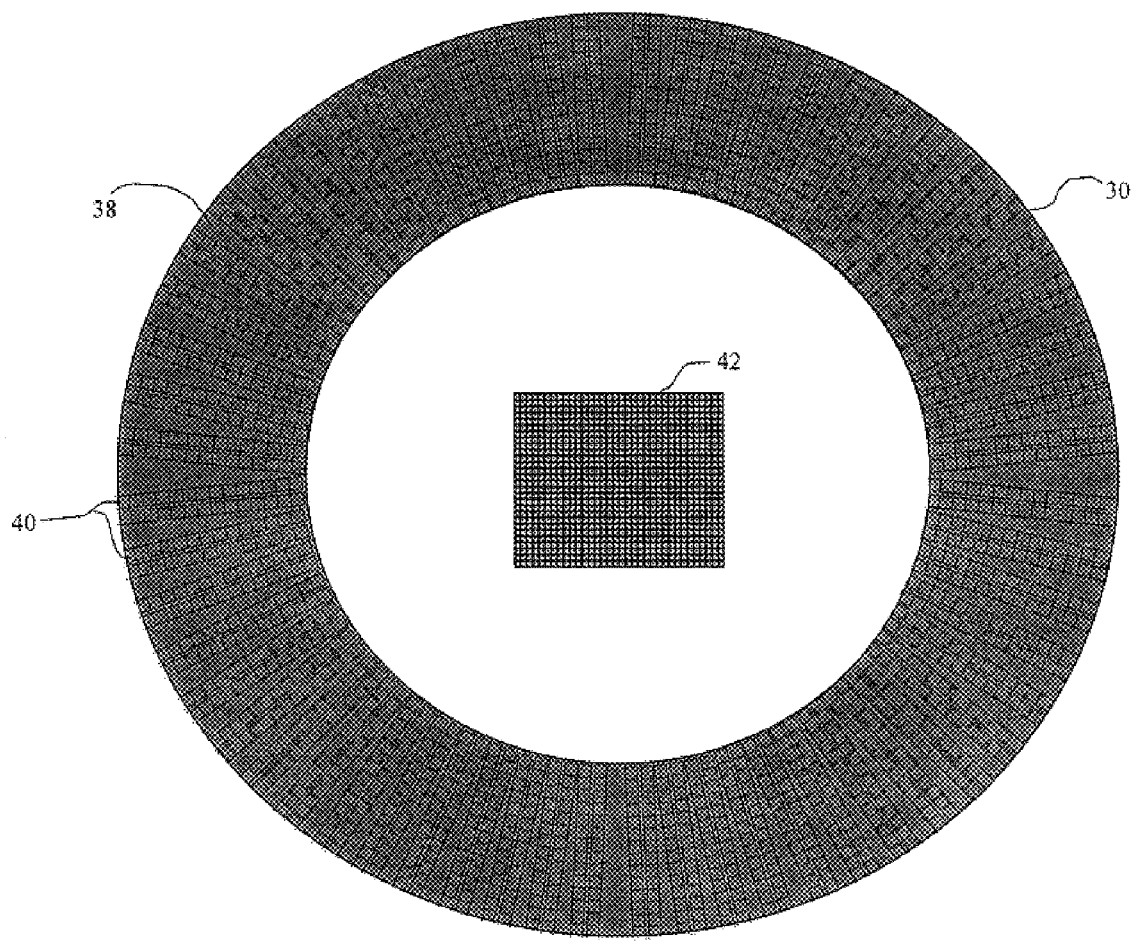
FIG. 3 is a bottom plan view of a probecard along line 3—3 of FIG. 2.
Figure 4:
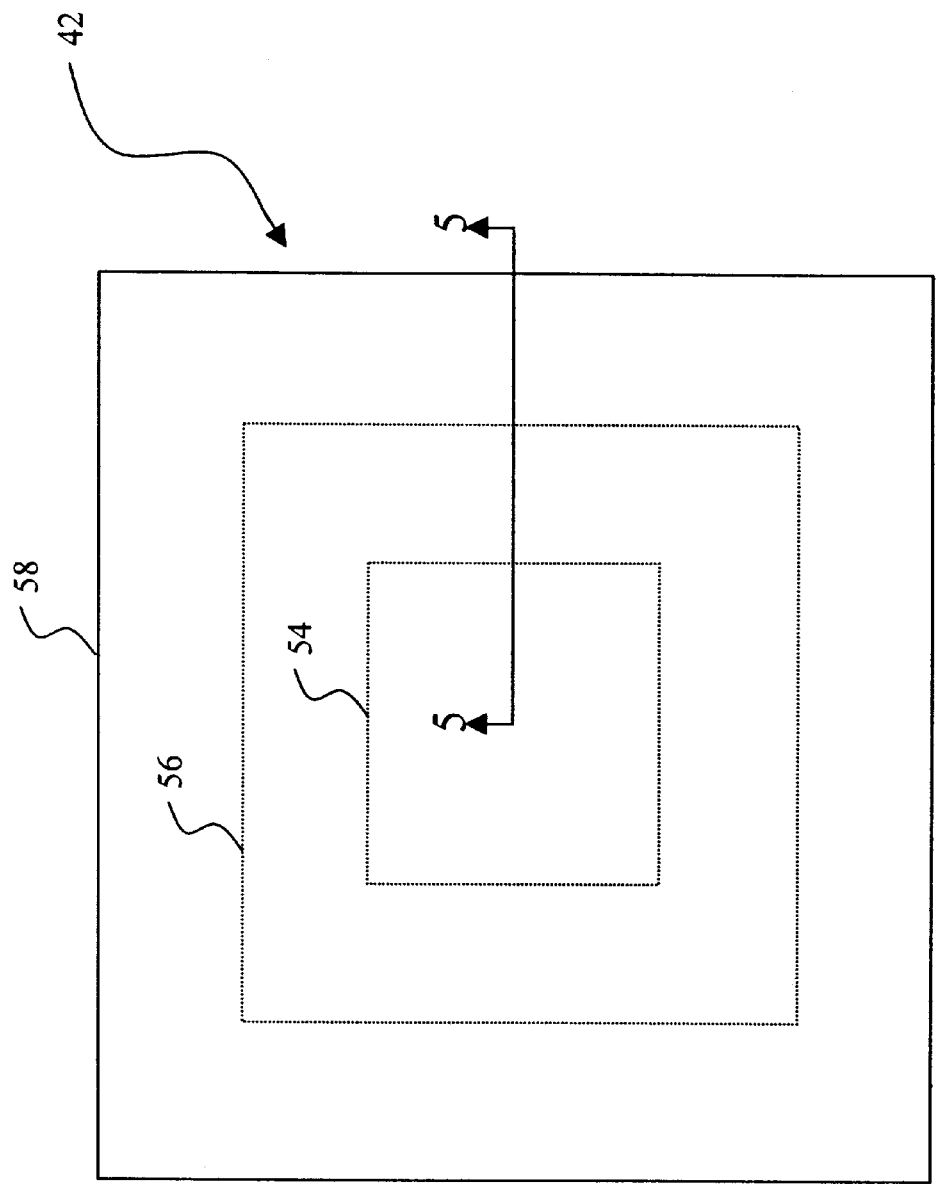
FIG. 4 is an enlarged partial bottom plan view, not to scale, of the contact array of FIG. 3.
Figure 5:
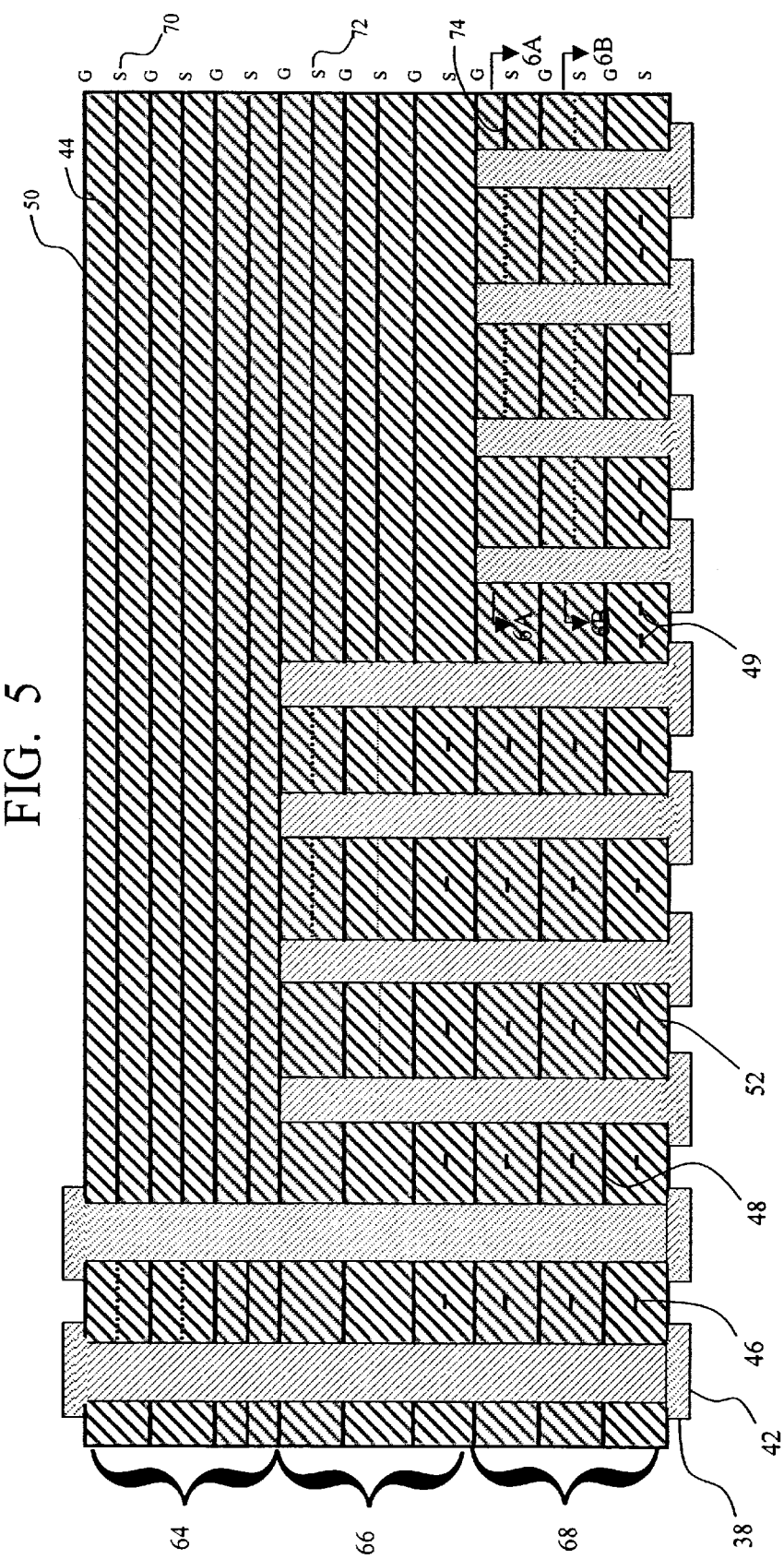
FIG. 5 is a cross-sectional view along line 5—5 of FIG. 4.

Referring now to FIGS. 3–5, the probecard 30 enables efficient routing of signal traces or paths 46 (FIGS. 4 and 5) between selected sets of staggered vias 52 (FIGS. 4 and 5). This minimizes the number of signal layers 44 required to rout the test signals between the automatic test system and the array of DUT's. Because each layer of the probecard is of a minimal thickness, eliminating any additional layers preserves compatibility with existing mounting hardware that supports probecard standard thicknesses.

Further referring to FIG. 3, the top layer (in phantom) of the probecard 30 defines an engagement surface layer that includes a planar fiberglass substrate formed with a peripheral annular array of copper contact pads 40 etched or deposited on the top of the card as is well known in the art. Formed centrally on the bottom of the probecard is a second contact surface 38 that includes a square or rectangular-shaped array of individually isolated probe contacts 42 for interfacing with the matching backside (not shown) of the probe pin interface 32. Preferably, the probe contact array comprises a 52×52 matrix, totaling 2704 contacts, but may be varied in number and size depending on the application. The contacts are separated on a grid of approximately 0.046 inches. A significant factor involved in the probecard construction, visually exemplified in FIG. 3, is the relative spaced-apart nature of the contact pads that individually require electrical connections to the densely packed array of probe contacts. The present invention carries out this critical electrical routing in three dimensions as more fully described below.

To effect efficient signal path routing between the contact pads 40 and the corresponding probe contacts 42, the probecard 30 employs a plurality of laminated signal layers 44 (FIG. 5) fixed in stacked relationship to the contact layer 38 that separately rout a selected number of microstrip traces 46. The signal layers are constructed similar to the contact layer, and include a planar substrate upon which is deposited a conductive pattern defining either a ground or power plane 48 or a signal path trace 46.

Further referring to FIG. 5, in order to ensure peak high frequency signal performance along each signal path, the signal layers 44 are sandwiched between respective ground layers 50. This characterizes each signal path as a predictable and relatively stable 50 ohm transmission line as is well known in the art. In actual practice, additional power layers (not shown) are also included in the probecard 30. Preferably, about thirty-four layers are utilized to construct a probecard with an overall thickness of approximately 0.25 inches. Of these layers, only about ten are available for signal routing.

Another factor necessary to maintain the proper signal impedance along each signal path involves the trace dimensions. Current 50 ohm design considerations require trace widths no less than approximately 0.005 to 0.008 inches, with spacings between traces no less than about 0.008 inches. Moreover, the spacings between ground planes are preferably set at approximately 0.015 inches apart. These requirements ensure minimal signal coupling, minimal cross-talk, and a 50 ohm trace.

Referring again to FIGS. 4 and 5, the conductive vias 52 are formed in each layer, and are arranged to include varying staggered heights and diameters. In the bottom contact layer, the vias connect to each prober contact 42. The vias join the respective pattern traces 46 of each signal layer 44 to the proper sets of contact pads 40 and prober contacts 42.

An important consideration in the structure of the vias requires a dimensional constraint of no greater than a 12:1 aspect ratio of height-to-diameter in order to effect adequate internal plating during manufacture. Thus, while the vias project through one or more layers of the probecard, the further the depth (or height), the larger the diameter must be to maintain the proper aspect ratio. With this consideration in mind, the inventor has unexpectedly discovered that by staggering the diameter and height of the interlayer vias to maintain the required aspect ratio, pairs of traces 49 in any one layer pattern may be routed between selected sets of adjacent vias.

Consistent with this discovery, a preferred configuration of the staggered via construction, as illustrated in FIGS. 4 and 5, employs relatively long (approximately 0.25 inch) and thick (approximately 0.025 inch diameter) vias in a center subsection 54 of the probe contact array 42. Progressively shorter and thinner subsections of vias are grouped in additional subsections 56 and 58 as the array expands outwardly from the center subsection. The subsections result from the lamination of a plurality of board-sets 64, 66 and 68. Fabrication of the board-sets to achieve this construction is more fully described below.

As seen more clearly in FIG. 5, by grouping the relatively large vias in the center of the array, fewer traces are blocked from the outside. In the outer subsections, with shorter via heights and relatively smaller diameters, respective trace pairs 49 (reference FIG. 5) may be routed between the shorter and thinner vias to eliminate what would otherwise result in an additional layer of traces. It should be understood that FIGS. 4 and 5 are not to scale and show a simplified construction of the present invention for purposes of clarity.

Figure 6B:
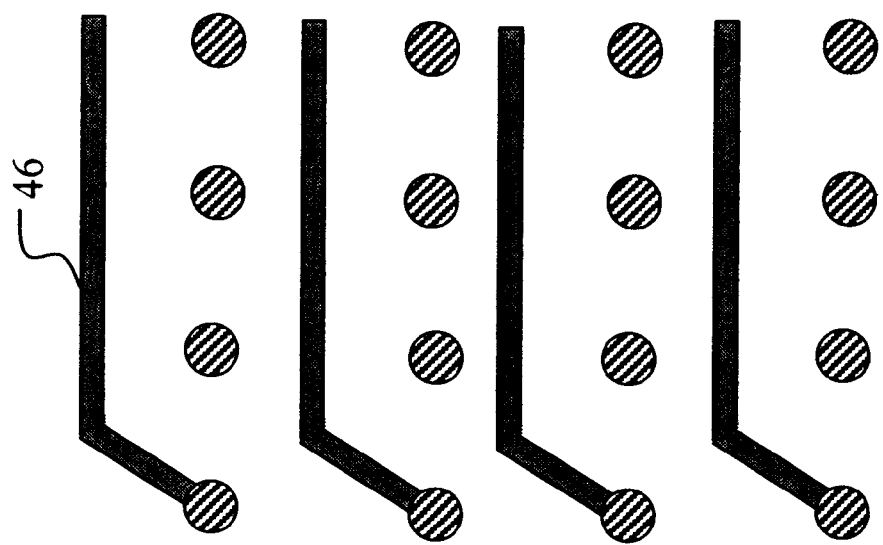
FIG. 6B is a partial cross-sectional view along line 6B—6B of FIG. 5.
Figure 6A:
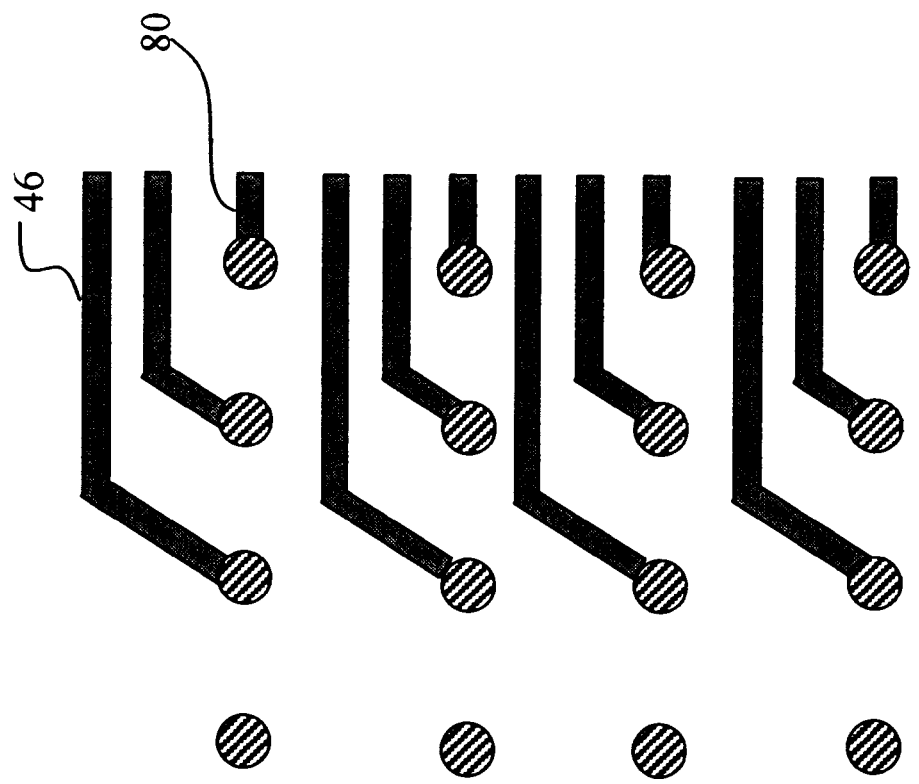
FIG. 6A is a partial cross-sectional view along line 6A—6A of FIG. 5.

Additionally, as shown in FIGS. 6A and 6B, the staggered via architecture of the present invention that results from the laminated board-sets provides the capability of forming additional traces on the top signal layers 70, 72 and 74 (FIG. 5) of the respective board-sets 64, 66 and 68 (FIG. 5). This is because direct trace-to-via connections 80 for the vias formed rearwardly on the top signal layers are possible due to the absence of any intervening vias. This is an important feature of the present invention because it allows additional traces to be routed on the top signal layers of the respective board-sets, thereby maximizing the trace density on those layers, and minimizing the overall number of layers in the probe card.

Manufacture of the probecard 30 of the present invention is carried out by a unique series of steps that ensures proper fabrication of the staggered vias 52. Referring now to FIG. 7, the process generally involves fabricating a plurality of multi-layered board-sets, and laminating the board-sets together to form the probe card.

Further referring to FIG. 7, rather than adding subsequent board layers to each side of an initially formed surface layer, which is typical in the art, any subsequent layers are added one-by-one in a "top-down" approach. This top-down methodology begins by forming an initial core substrate, at step 100. The core substrate preferably comprises a fully-baked material such as GETEC, Teflon or FR4. Microstrip material is then deposited on the core material, at step 102, to form a conductive layer. The microstrip is exposed to an etching procedure, at step 104, to define a predetermined signal path pattern. After the pattern is formed, a layer of half-baked pre-preg material is applied over the pattern, at step 106. A second layer of conductive microstrip material is then deposited over the pre-peg, at step 108, to form a ground plane. A subsequent core substrate is then deposited over the ground plane, at step 110, followed by steps 102, 104, 106 and 108. This sequence is repeated until the board-set layers are all formed, at step 112. Preferably, this occurs after fabrication of about six signal layers.

Once the board-set is complete, one or more sets of throughbores are formed through the board-set layers to define the vias, at step 114. A plating and filling operation is then carried out, at step 116, to plate and fill the vias with a conductive material. If more than one board-set is fabricated, then the new board-set is laminated to the previously constructed board-set, at step 118. The respective via constructions in the respective board-sets cooperate to define sub-sections of vias that resemble a "pyramid" shape (FIG. 4). The probe card is complete after a plurality of board-sets have been laminated in this top-down approach.

The completed probe card 30 is then secured within the alignment fixture 34 (FIG. 1) to form a part of the probe card assembly 24. Because the alignment fixture is of a standardized construction, the overall thickness of the probe card must be within a standardized thickness on the order of approximately 0.25 inches. The present invention preserves the standardized probecard thickness to avoid the necessity of redesigning the alignment fixture, thereby reducing overall costs.

In operation, the probecard assembly 24 is systematically registered over and touched-down onto arrays of DUT's on the wafer 26 by the test head 14 in a "step-and-repeat" fashion. For each array of DUT's, the test controller 12 issues commands for the pin electronics 18 to generate high frequency test signals on the order of from 125 MHz to 1.6 GHz. The signals are fed through the probecard 30 for application to the input pins of the DUT's. Output signals from the DUT's that are generated in response to the applied vectors are captured by selected contacts and routed back through the probecard to the test controller where they are analyzed. The analysis includes, among other tests, a comparison of the captured waveforms to expected waveforms to verify proper operability of the DUT's. Once the testing for the DUT array is complete, the prober is moved to the next array, and the foregoing test sequence repeated.

Figure 8:
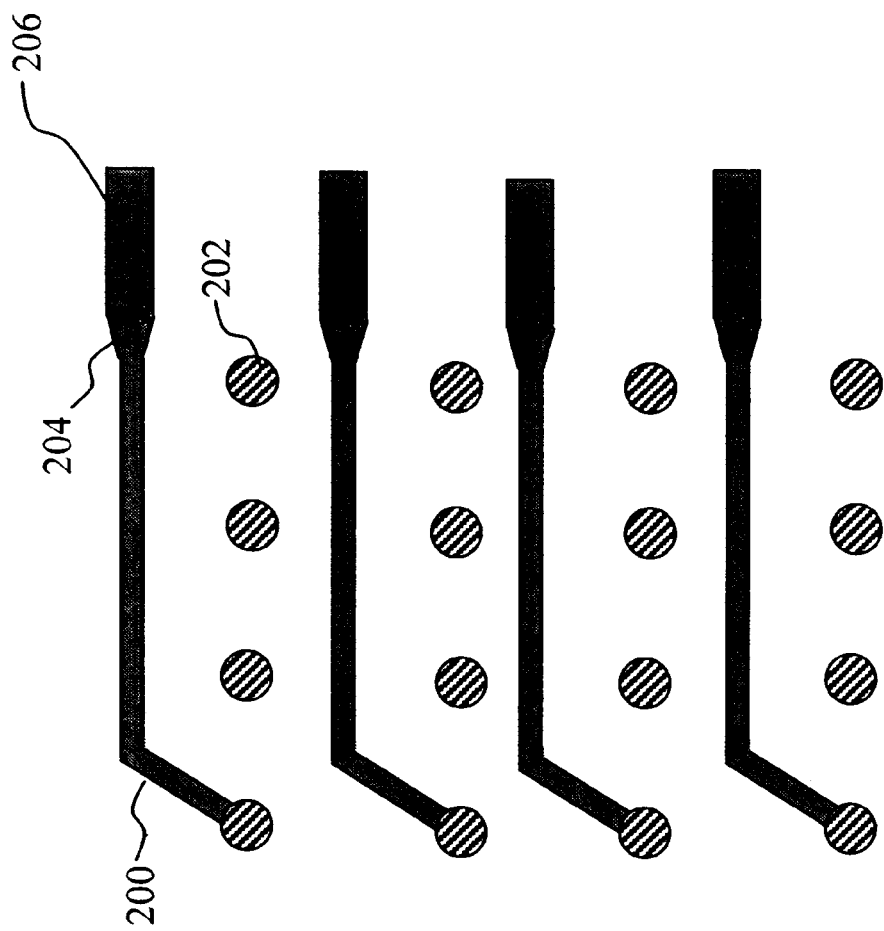
FIG. 8 is a view similar to FIG. 6B illustrating a further embodiment of the present invention.

Referring now to FIG. 8, a second embodiment of the present invention improves the bandwidth performance of the probe card even further by tailoring the structure of the microstrip traces 200 that pass between adjacent vias 202. The overall construction of the probe card according to the second embodiment is substantially similar to that of the first embodiment. However, the microstrip traces that pass between vias are formed with a tapered section 204 that necks down from a 50 ohm section 206 to a thinner transmision line with a higher characteristic impedance.

The inventor has discovered that tapering the microstrip traces causes an increase in inductance along the trace. This inductive characteristic offsets any undesirable frequency response effects that result from excess capacitance created by the formed via-trace terminations. The result is a more "ideal" 50 ohm transmission line characteristic in the 50 ohm section 206, which allows higher frequency propagation with little attenuation.

Those skilled in the art will appreciate the many benefits and advantages afforded by the present invention. Of significant importance is the implementation of staggered vias that provide the capability of increasing the size of a probe contact array without having to add further layers. Since the number of layers is minimized, compatibility with existing probecard mounting hardware is preserved. This, in turn, minimizes any additional costs associated with the improved signal routing.

A further advantage afforded by the present invention involves the superior bandwidth performance. The construction of the probe card provides the capability of routing high frequency signals on the order of up to 125 MHz to 250 MHz with minimal attenuation. This is realized by substantially maintaining a 50 ohm transmission line characteristic for each signal path trace.

While the invention has been particularly shown and described with reference to the preferred embodiments thereof, it will be understood by those skilled in the art that various changes in form and detail may be made therein without departing from the spirit and scope of the invention.

What is claimed is:

1. A multi-level circuit board for efficiently routing electrical signals, said circuit board including:
   an engagement surface layer comprising a first substrate and a set of contact pads formed through said substrate and disposed peripherally around said substrate across a relatively large surface area, and a set of engagement contacts formed through said substrate and arrayed in a densely packed surface area, said engagement contacts forming a substantially one-to-one correspondence with said contact pads;
   a plurality of subsequent layers disposed in fixed stacked relationship to said engagement surface layer, each subsequent layer including
      a subsequent substrate, and
      a conductive pattern formed on said subsequent substrate and defining a plurality of signal paths; and
   conductive vias coupled to said contact pads and said engagement contacts and formed through said engagement surface layer and one or more of said plurality of subsequent layers to communicate with said respective signal paths, said conductive vias including selected sets of staggered vias formed in staggered heights and diameters to optimize the routing of said signal paths along said respective subsequent layers.

2. A multi-level circuit board according to claim 1 wherein:
   said engagement contacts are arranged according to a minimum center-to-center spacing; and
   said staggered vias have respective center-to-center spacings corresponding to said engagement contact center-to-center spacings.

3. A multi-level circuit board according to claim 2 wherein:
   said selected sets of staggered vias include a first subsection of relatively large vias disposed centrally through said circuit board; and
   said circuit board includes subsequent subsections of progressively smaller vias arrayed outwardly from said first subsection.

4. A multi-level circuit board according to claim 3 wherein:
   said conductive patterns include selected groups of multiple traces routed in bisecting relationship between said adjacent respective progressively smaller vias.

5. A multi-level circuit board according to claim 1 wherein:
   said selected sets of staggered vias are formed with respective heights and diameters; and
   the respective ratios of said respective heights to said respective diameters do not exceed 12:1.

6. A multi-level circuit board according to claim 1 wherein:
   said conductive patterns include selected traces tapered in width to create an inductive characteristic sufficient to offset capacitive effects generated by said vias.

7. A probecard for use in an automatic test system to rout signals between a test controller and a parallel array of devices under test, said probecard including:
   an engagement surface layer comprising a disk-shaped substrate and formed peripherally with an annular array of relatively spaced-apart contact pads, and a centrally disposed rectangular array of relatively densely packed engagement contacts, said engagement contacts forming a one-to-one correspondence with said contact pads;
   a plurality of signal layers disposed in fixed stacked relationship to said engagement surface layer, each signal layer including
      a substrate, and
      a conductive pattern formed on said substrate and defining a plurality of signal paths for routing signals between selected sets of contact pads and engagement contacts; and
   conductive vias coupled to said contact pads and engagement contacts and formed through said engagement surface layer and one or more of said signal layers to communicate with said signal paths, said conductive vias including selected sets of staggered vias configured to optimize the routing of said signal paths along said respective signal layers.

8. A probecard according to claim 7 wherein:
   said selected sets of staggered vias are staggered in height.

9. A probecard according to claim 7 wherein:
   said selected sets of staggered vias are staggered in diameter.

10. A probecard according to claim 9 wherein:
    said engagement contacts are arranged according to a minimum center-to-center spacing; and
    said staggered vias have respective center-to-center spacings corresponding to said engagement contact center-to-center spacings.

11. A probecard according to claim 10 wherein:

said selected sets of staggered vias include a first subsection of relatively large vias disposed centrally through said circuit board; and said circuit board includes subsequent subsections of progressively smaller vias arrayed outwardly from said first subsection.

12. A probecard according to claim 11 wherein:

said conductive patterns include selected groups of multiple traces routed in bisecting relationship between said adjacent respective progressively smaller vias.

13. A probecard according to claim 7 wherein:

said selected sets of staggered vias are formed with respective heights and diameters; and the respective ratios of said respective heights to said respective diameters do not exceed 12:1.

14. A massively parallel automatic test system for simultaneously testing an array of devices under test on a wafer, said system including:

a test controller;

a test head disposed downstream of said test controller;

a wafer fixture for mounting a wafer having a plurality of arrays of devices under test; and a probecard carried by said test head in overlying relationship to said wafer for coupling signals between said test controller and said array of devices under test, said probecard including a contact layer comprising a disk-shaped substrate and formed peripherally with an annular array of relatively spaced-apart contact pads, and a centrally disposed rectangular array of relatively densely packed probe contacts a plurality of signal layers disposed in fixed stacked relationship to said contact layer, each signal layer including a substrate, and a conductive pattern formed on said substrate and defining a plurality of signal paths for routing signals between selected sets of contact pads and engagement contacts, and conductive vias coupled to said contact pads and probe contacts and formed through said contact layer and one or more of said signal layers to communicate with said signal paths, said conductive vias including selected sets of staggered vias configured to optimize the routing of said signal paths along said respective signal layers.

15. A method of manufacturing a multi-level circuit board, said method including the steps of:

fabricating a first board-set, said first board-set formed with a plurality of board layers and including a first set of conductive vias formed through said board layers;

fabricating a second board-set, said second board-set formed substantially similar to said first board set and and including a second set of conductive vias disposed in corresponding alignment with said first set of conductive vias, said second board set further including a staggered set of conductive vias disposed in an adjacent array to said second set of vias; and laminating said second board-set beneath said first board-set to couple said first and second sets of vias and define a first via sub-section, said staggered set of conductive vias defining a second via sub-section.

* * * * *